United States Patent
Harada et al.

(10) Patent No.: US 8,416,324 B2
(45) Date of Patent: Apr. 9, 2013

(54) IMAGING DEVICE HAVING PIXELS AND A/D CONVERSION ELEMENTS

(75) Inventors: Yasunari Harada, Ebina (JP); Yuichi Gomi, Tokyo (JP)

(73) Assignee: Olympus Corporation, Tokyo (JP)

( * ) Notice: Subject to any disclaimer, the term of this patent is extended or adjusted under 35 U.S.C. 154(b) by 105 days.

(21) Appl. No.: 12/958,904

(22) Filed: Dec. 2, 2010

(65) Prior Publication Data

US 2011/0074987 A1 Mar. 31, 2011

Related U.S. Application Data

(63) Continuation of application No. PCT/JP2009/060257, filed on Jun. 4, 2009.

(30) Foreign Application Priority Data

Jun. 9, 2008 (JP) ................................ 2008-150316

(51) Int. Cl.
H04N 5/217 (2011.01)
H04N 5/228 (2006.01)
(52) U.S. Cl. .................................... 348/241; 348/222.1
(58) Field of Classification Search .................. None
See application file for complete search history.

(56) References Cited

U.S. PATENT DOCUMENTS

| | | | | |
|---|---|---|---|---|
| 4,366,508 A | * | 12/1982 | Crean et al. | 358/451 |
| 4,679,096 A | * | 7/1987 | Nagashima | 358/451 |
| 5,881,162 A | * | 3/1999 | Ishimitsu | 382/132 |
| 6,466,151 B2 | * | 10/2002 | Nishii et al. | 341/155 |
| 2003/0201927 A1 | | 10/2003 | Watanabe et al. | |
| 2005/0206548 A1 | * | 9/2005 | Muramatsu et al. | 341/172 |
| 2005/0231624 A1 | * | 10/2005 | Muramatsu et al. | 348/311 |
| 2005/0242849 A1 | * | 11/2005 | Muramatsu et al. | 327/151 |
| 2005/0253942 A1 | * | 11/2005 | Muramatsu et al. | 348/273 |
| 2006/0097902 A1 | * | 5/2006 | Muramatsu et al. | 341/155 |

(Continued)

FOREIGN PATENT DOCUMENTS

| | | |
|---|---|---|
| CN | 1681211 A | 10/2005 |
| JP | 2004-007385 A | 1/2004 |
| JP | 2005-323331 A | 11/2005 |
| JP | 2006-287879 A | 10/2006 |

OTHER PUBLICATIONS

Watanabe, Takamoto et al. "An All-Digital Analog-to-Digital Converter With 12- mV/LSB Using Moving-Average Filtering," IEEE Journal of Solid-State Circuits, Jan. 2003, vol. 38, No. 1, pp. 120-125.
International Search Report of PCT/JP2009/060257, mailing date Sep. 8, 2009.

(Continued)

*Primary Examiner* — Justin P Misleh
(74) *Attorney, Agent, or Firm* — Westerman, Hattori, Daniels & Adrian, LLP

(57) ABSTRACT

An A/D conversion section (11) counts clocks whose frequency corresponds to the size of output signals from pixels (10a), and digitalizes the result so as to create count values, and also calculates a difference between a first count value that relates to the output signal during a reset period of a pixel, and a second count value that relates to the output signal during an exposure period of the pixel, and then outputs this difference as an imaging signal for this pixel. A control unit (12) controls the A/D conversion section such that the length of the counting period of the first count value is equal to the length of the counting period of the second count value.

7 Claims, 14 Drawing Sheets

U.S. PATENT DOCUMENTS

| | | | |
|---|---|---|---|
| 2006/0243885 A1 | 11/2006 | Watanabe | |
| 2007/0008206 A1* | 1/2007 | Tooyama et al. | 341/155 |
| 2008/0136948 A1* | 6/2008 | Muramatsu | 348/294 |
| 2008/0224913 A1* | 9/2008 | Suzuki et al. | 341/155 |
| 2010/0309319 A1* | 12/2010 | Yanada et al. | 348/207.1 |
| 2011/0164160 A1* | 7/2011 | Harada | 348/302 |

OTHER PUBLICATIONS

Chinese Office Action mailed May 14, 2012, issued in corresponding Chinese Patent Application No. 200980121360.4, w/ English translation.

* cited by examiner

FIG. 14
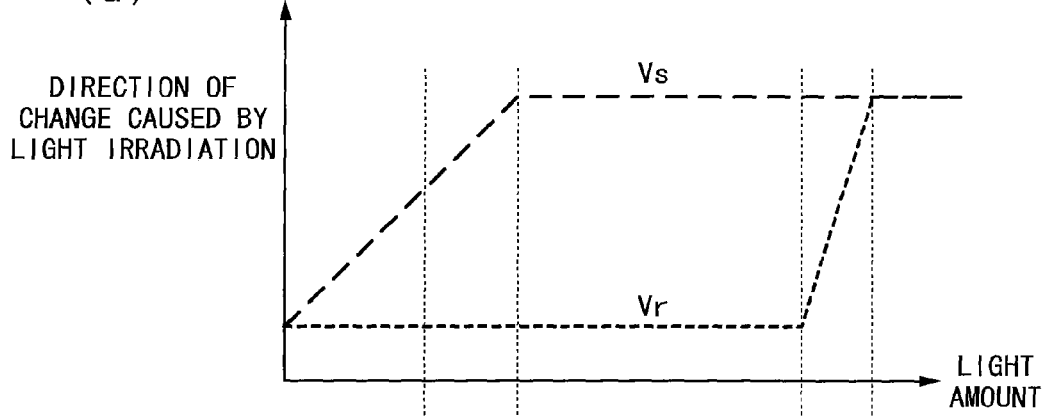
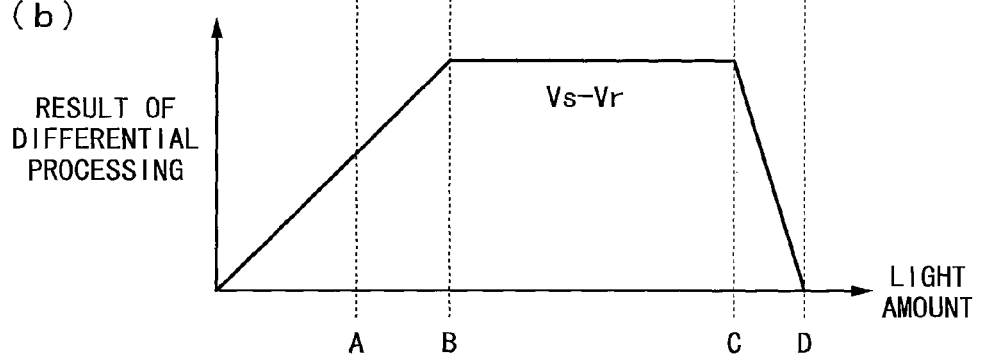

IMAGING DEVICE HAVING PIXELS AND A/D CONVERSION ELEMENTS

CROSS-REFERENCE TO RELATED APPLICATIONS

The present application is a continuation of PCT/JP/2009/060257, filed on Jun. 4, 2009, which claims priority from Japanese Patent Application No. 2008-150316, filed Jun. 9, 2008, the entire contents of which are incorporated herein by reference.

TECHNICAL FIELD

The present invention relates to an imaging device on which at least pixels and A/D conversion circuits are mounted.

TECHNICAL BACKGROUND

Conventionally, an imaging element that is provided with a photoreceptor element array in which pixel cells having at least a photoelectric conversion element are arranged in a two-dimensional array, and with a plurality of A/D conversion circuits that perform A/D conversion on optical signals received from the photoreceptor element array, and that is constructed as a single IC chip, and also a method of controlling this imaging element have been disclosed. High-function processing such as zoom-in functions and the like can be efficiently executed by performing A/D conversion on only the two-dimensional areas required by the imaging device, or by improving the resolution of the A/D conversion without changing the range of the voltage capable of undergoing A/D conversion. In addition, technology that achieves a miniaturization of the imaging device, as well as increases in the speed and accuracy thereof is also disclosed (see, for example, Patent document 1).

Moreover, as the A/D conversion circuit of Patent document 1, for example, the structure described in Non-patent document 1 is known. As is shown in FIG. 10, an A/D conversion circuit 20 described in Non-patent document 1 has a pulse transit circuit 1, an encoder and latch 2, a counter 3, latches 4 and 5, and a calculator 6. The functions of each of these structures are described below.

The pulse transit circuit 1 has a structure in which a single NAND circuit 101 (NAND) which serves as a startup inverter circuit that operates after receiving a pulse signal StartP in one input terminal thereof, and a plurality of inverters (INV) 102 which serve as inverter circuits are connected in a ring shape. The encoder and latch 2 encodes and holds output signals from the pulse transit circuit 1 in synchronization with a sampling signal CKs. The counter 3 counts output signals from the pulse transit circuit 1.

The latch 4 holds output signals from the counter 3 in synchronization with the sampling signal CKs. The latch 5 holds signals obtained by adding together the output signals from the encoder and latch 3 and the latch 4 in synchronization with the sampling signal CKs. The calculator 6 calculates the difference between a previous signal and a current signal using the latch 5, and outputs the result to an external latter-stage circuit. In addition, a power supply line 7A supplies power to the NAND circuit 101 and to the inverters 102 within the pulse transit circuit 1, and an input terminal 8A to which is input an analog input signal Vin which is to undergo A/D conversion is connected to this power supply line 7A.

Next, an operation of the A/D conversion circuit 20 will be described. In the pulse transit circuit 1, the pulse signal StartP is made to orbit the single NAND circuit 101 and plurality of inverters 102 which are formed in a ring shape. The number of times the pulse signal StartP orbits the pulse transit circuit 1, and also the position of the pulse signal StartP within the NAND circuit 101 and inverters 102 change in accordance with the size of the analog input signal Vin and the period of the sampling signal CKs. For example, as is shown in FIG. 11A, if the size of the analog input signal Vin increases, the propagation delay time of the NAND circuit 101 and inverters 102 becomes smaller. Because of this, the number of times the pulse signal StartP orbits the pulse transit circuit 1 increases.

The encoder and latch 2 detects the position of the pulse signal StartP within the NAND circuit 101 and inverters 102, and outputs the result as binary digital data. The counter 3 counts the number of times the pulse signal StartP has orbited the pulse transit circuit 1, and outputs the result as binary digital data. The latch 4 latches the digital data output from the counter 3. The latch 5 holds digital data obtained by adding together the digital data from the latch 4 as a high-order bit and the digital data from the encoder and latch 2 as a low-order bit. The calculator 6 calculates the difference between the digital data after it has been held in the latch 5 and the digital data before it is held in the latch 5, and outputs the result to an external latter-stage circuit.

Next, as is shown in FIG. 11B, the above-described A/D conversion circuit 20 periodically outputs digital data DT (DT1, DT2, DT3, . . . ) that corresponds to the analog input signal Vin in accordance with the period of the sampling signal CKs.

Moreover, in order to obtain more accurate imaging signals in the imaging element, it is necessary to calculate the difference between the reset level of pixel cells and the signal level of the signals accumulated during an exposure period. This is described below.

FIG. 12 is a structural view showing a pixel cell of a single pixel. As is shown in FIG. 12, a pixel cell has a photoelectric conversion element 21, a memory element 22, a first transistor 23, a second transistor 24, a third transistor 25, and a fourth transistor 26.

The functions of each of these structures are described below.

The photoelectric conversion element 21 converts a subject image into a signal charge. The memory element 22 holds the signal charges accumulated in the photoelectric conversion element 21 and converts them into voltage. The first transistor 23 transmits the signal charges accumulated in the photoelectric conversion element 21 to the memory element 22. The second transistor 24 resets the memory element 22. The third transistor 25 amplifies and then outputs the signals held in the memory element 22. The fourth transistor 26 controls the selection of pixel signals by controlling whether or not a signal amplified by the third transistor 25 is output to a common signal line 27.

Note that a source follower circuit is formed by the third transistor 25 and by a load current source (not shown) provided in the common signal line 27. In addition, the first transistor 23 is controlled by a signal (φTR) from a control circuit (not shown). The second transistor 24 is controlled by a signal (φRS) from this control circuit. The fourth transistor 26 is controlled by a signal (φSE) from this control circuit.

Next, an operation of this pixel cell will be described with reference made to FIG. 13. In the timing chart shown in FIG. 13, the level of the memory element 22 which is connected to the gate of the third transistor 25 is shown by FD, while the pixel output level which is output to the common signal line 27 is shown by Vsig.

When the control pulse φSE changes to an [H] level at a timing t1 and the fourth transistor 26 changes to ON, the output from the third transistor 25 is output to the common signal line 27. Thereafter, when the control pulse φRS changes to the [H] level at a timing t2 and the second transistor 24 changes to ON, the gates of the memory element 22 and the third transistor 25 are reset by a power supply VDD. Thereafter, when the control pulse φRS changes to the [L] level and the second transistor 24 changes to OFF, the level FD of the memory element 22 changes to a level shown by Vr' in the graph, and the pixel output level Vsig changes to Vr. This Vr is the reset level of the pixel output.

When the control pulse φTR changes to an [H] level at a timing t3 and the first transistor 23 changes to ON, the signal charge which has been accumulated in the photoelectric conversion element 21 in accordance with the light intensity is transmitted to the memory element 22. In addition, the level FD of the memory element 22 and the pixel output level Vsig also change. Thereafter, when the control pulse φTR changes to an [L] level and the first transistor 23 changes to OFF, the level FD of the memory element 22 changes to a level shown by Vs' in the graph, and the pixel output level Vsig changes to Vs. This Vs is the signal level of the pixel output of the signal charge accumulated in the photoelectric conversion element 21. Thereafter, when the control pulse φSE changes to an [L] level at a timing t4, the selection of the relevant pixel is ended and the pixel output to the common signal line 27 is cut off.

Here, irregularities are generated in the reset level Vr due to thermal noise and the like caused by the on-resistance of the second transistor 24. Moreover, irregularities are also generated between pixels in the reset level Vr arising from threshold value irregularities in the third transistor 25. Accordingly, all of these irregularities form noise in the reset level Vr. Because of this, noise is also generated in the signal level Vs which changes based on the reset level Vr. Accordingly, in order to detect highly accurate imaging signals from which noise has been removed, it has been necessary to detect the difference between the reset level Vr and the signal level Vs.

PRIOR TECHNOLOGY DOCUMENTS

Patent Documents

[Patent document 1] Japanese Patent Application, First Publication No. 2006-287879

Non-Patent Documents

[Non-patent document 1] IEEE JOURNAL OF SOLID-STATE CIRCUITS, Vol. 38, NO. 1, January 2003, "An All-Digital Analog-to-Digital Converter With 12-uV/LSB Using Moving-Average Filtering"

DISCLOSURE OF THE INVENTION

Problems to be Solved by the Invention

As is described above, in an A/D conversion circuit that is mounted on an imaging device, it is necessary to calculate the difference between a count value of an output signal during a reset period of a pixel cell (i.e., a reset signal), and a count value of an output signal during exposure (i.e., a video signal), and to output this difference as an imaging signal (i.e., a signal obtained by subtracting the reset signal from the video signal) at the relevant pixel. However, in the conventional technology, no consideration is given to the problem of accurately detecting a video signal in an A/D circuit that performs A/D conversion in accordance with an analog input voltage value Vin during an arbitrary period set by a sampling signal.

The present invention was conceived in view of the above described problem and it is an object thereof to provide an imaging device that is able to detect an imaging signal with a high degree of accuracy.

Means for Solving the Problem

The present invention was conceived in order to solve the above described problem and is an imaging device that includes: a pixel section in which a plurality of pixels are arrayed two-dimensionally; an A/D conversion section that counts clocks which includes frequency corresponds to the size of output signals from the pixels, and digitalizes the result so as to create count values, and that also calculates a difference between a first count value that relates to the output signal during a reset period of a pixel, and a second count value that relates to the output signal during an exposure period of the pixel, and then outputs this difference as an imaging signal for this pixel; and a control unit that controls the A/D conversion section such that the length of a counting period of the first count value is equal to the length of a counting period of the second count value.

Moreover, in the imaging device of the present invention it is desirable for the control unit to stop operations of the A/D conversion section outside the counting periods.

Moreover, in the imaging device of the present invention, it is desirable for the control unit to control the A/D conversion section such that it holds the count values at each of the start and the finish of the counting of the clocks.

Moreover, in the imaging device of the present invention, it is desirable for the control unit to control the A/D conversion section such that it initializes the count value at the start of the counting of the clocks, and holds the count values at the finish of the counting of the clocks.

Furthermore, in the imaging device of the present invention, it is desirable for there to be further provided a monitoring section that monitors the length of the counting period of the first count values and the length of the counting period of the second count values. In addition, it is desirable for the control unit to control the A/D conversion section such that, based on the results of the monitoring by the monitoring section, the imaging signals that are to be output are corrected.

Furthermore, in the imaging device of the present invention, it is desirable for there to be further provided a determination section that determines the first count values. In addition, it is desirable for the control unit to control the A/D conversion section such that, based on the results of the determination by the determination section, the first count values are replaced with predetermined values.

Furthermore, in the imaging device of the present invention, it is desirable for there to be further provided a determination section that determines the first count values. In addition, it is desirable for the control unit to control the A/D conversion section such that, based on the results of the determination by the determination section, the imaging signals of the pixels are replaced with predetermined values.

Effects of the Invention

According to the present invention, it is possible to detect an imaging signal with a high degree of accuracy by performing control such that the length of the counting period of a first count value is the same as the length of the counting period of a second count value.

BRIEF DESCRIPTION OF THE DRAWINGS

FIG. 14 (a) is a graph used to illustrate a black level depression phenomenon in which a reset level Vr and signal level Vs are shown for the light quantity. FIG. 14 (b) is a graph used to illustrate a black level depression phenomenon in which a differential result Vs–Vr of the reset level Vr and signal level Vs is shown.

BEST EMBODIMENTS FOR IMPLEMENTING THE INVENTION

Hereinafter, embodiments of the present invention will be described with reference made to the drawings.

First Embodiment

Figure 1:
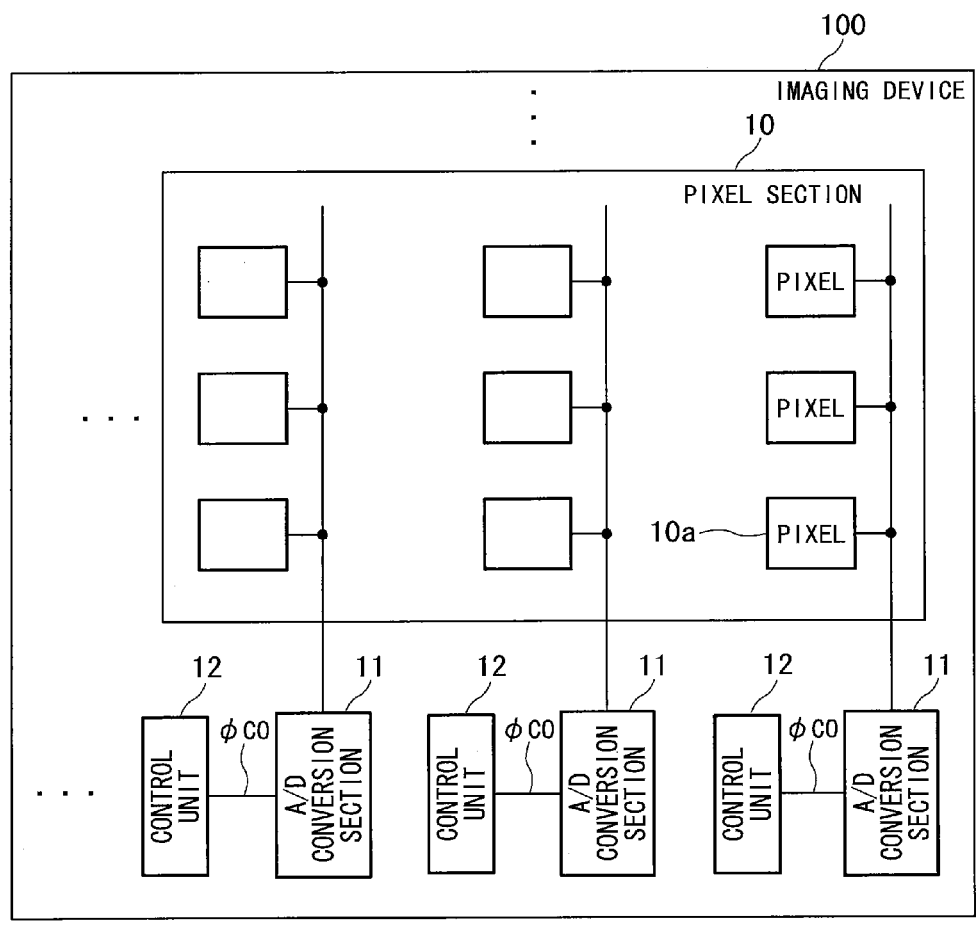
FIG. 1 is a block diagram showing the structure of an imaging device according to a first embodiment.

Firstly, a first embodiment of the present invention will be described. FIG. 1 shows the structure of an imaging device according to the present embodiment. As is shown in FIG. 1, an imaging device 100 has a pixel section 10 in which a plurality of pixels 10a are arrayed two-dimensionally, A/D conversion sections 11, and control units 12. The functions of each of these structures will now be described.

The pixel section 10 converts a subject image into an imaging signal in each pixel 10a. The A/D conversion section 11 counts clocks which includes frequency corresponds to the size of the output signals from the pixels 10a. In addition, the A/D conversion section 11 then performs calculations based on these count values, and outputs the output signals from the pixels 10a as imaging signals for the pixels 10a. The control unit 12 supplies the A/D conversion section 11 with various types of signals including signals (φCO)(that control the count period of the A/D conversion section 11, and thus controls the A/D conversion section 11.

Figure 12:
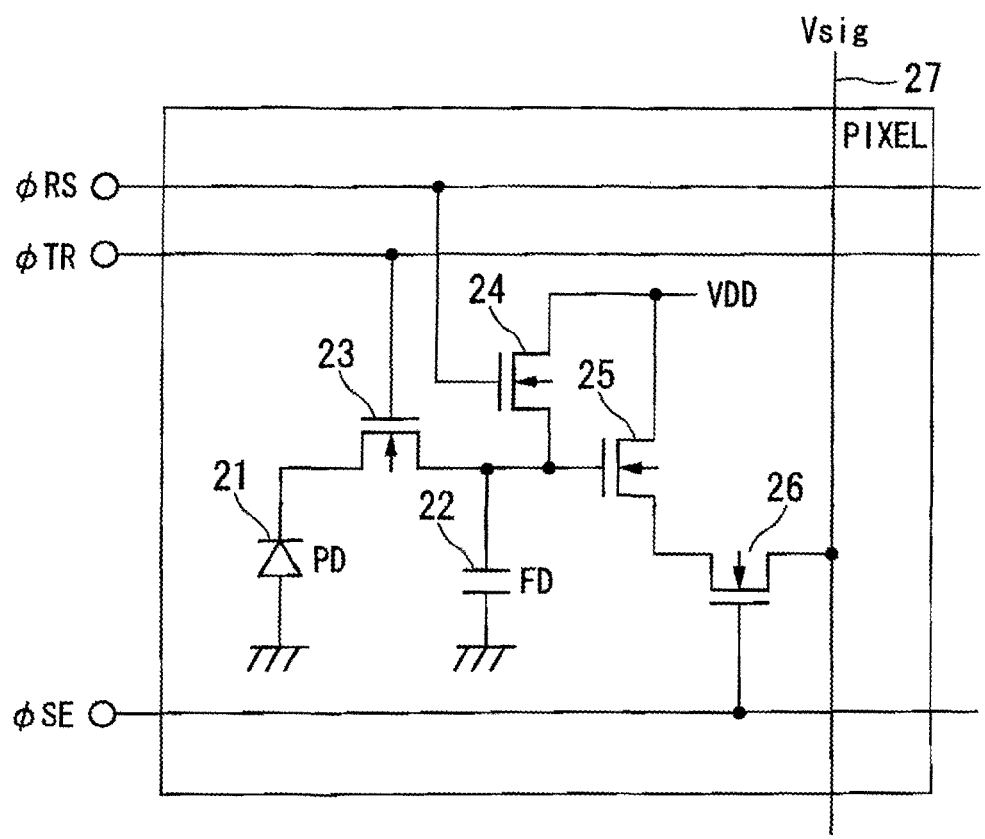
FIG. 12 is a circuit structure diagram showing the structure of a pixel cell.
Figure 13:
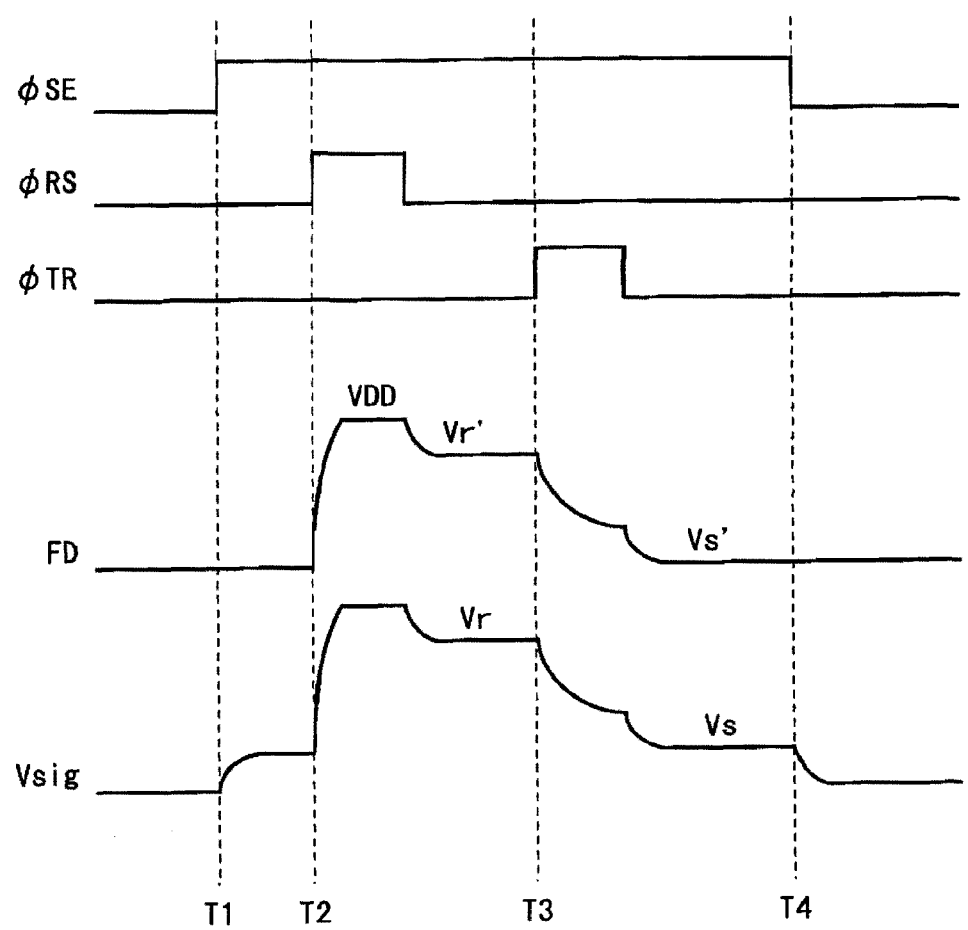
FIG. 13 is a timing chart used to illustrate an operation of a pixel cell.

The structure and operations of the A/D conversion section 11 are fundamentally the same as those of the A/D conversion circuit described in Patent document 1, however, there are differences in the latch 5. The latch 5 is described below in detail. Moreover, the structure of the pixels 10a is the same as the structure shown in FIG. 12. Furthermore, in the present embodiment, one group which is made up of an A/D conversion section 11 and a control unit 12 is provided for each pixel row, however, it is also possible to provide a single group which is made up of an A/D conversion section 11 and a control unit 12 for all of the pixel rows. Furthermore, it is also possible for the pixel section 10 and the A/D conversion sections 11 to both be placed inside an imaging element. Moreover, it is also possible for the pixel section 10 to be placed inside an imaging element, and for the A/D conversion sections 11 to be placed outside the imaging element.

Next, operating examples which are characteristic of an imaging device having the above described structure will be described with the use of a timing chart.

First Operating Example

Figure 2:
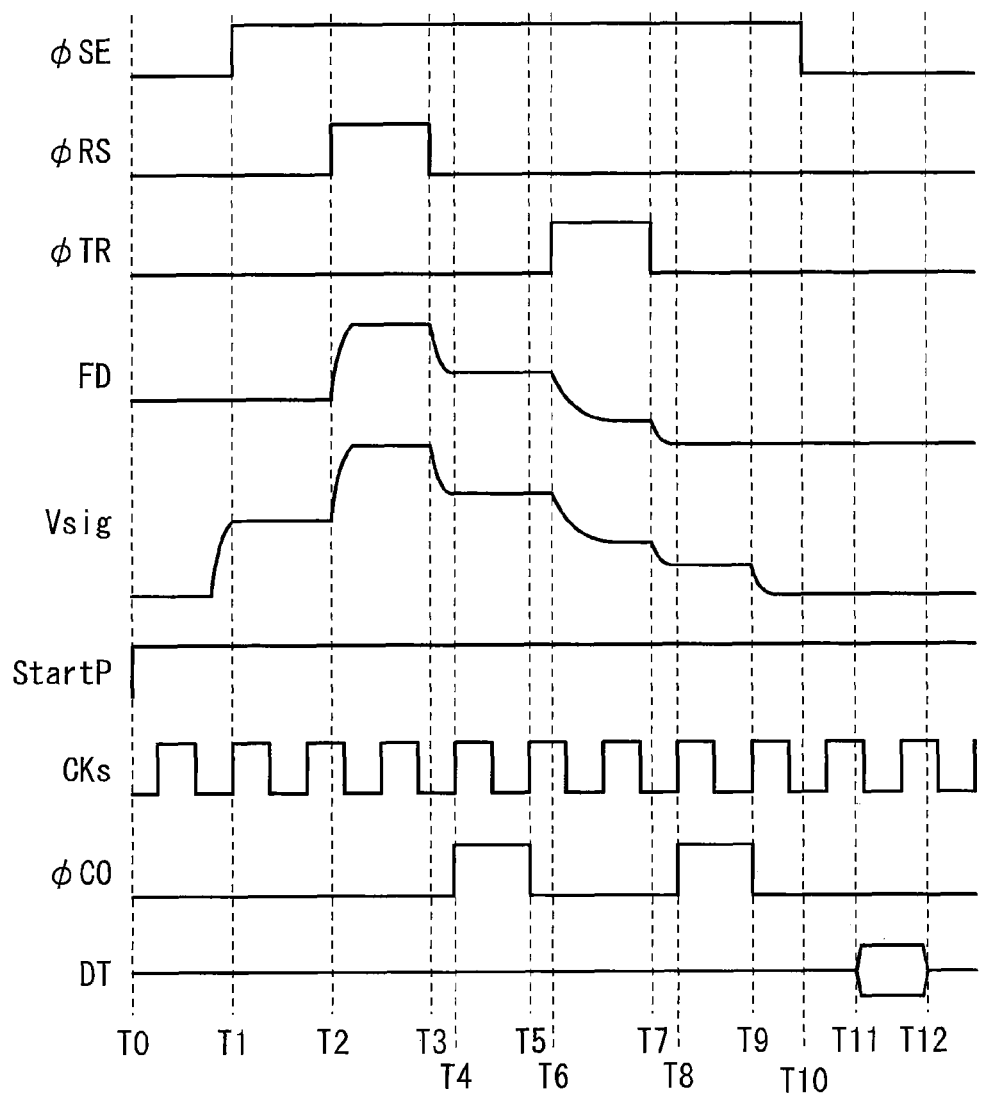
FIG. 2 is a timing chart showing an operation of the imaging device according to the first embodiment.

Firstly, a first operating example will be described. FIG. 2 shows a first operating example of the imaging device according to the present embodiment.

Once the photoelectric conversion element 21 has completed the conversion of the subject image to an imaging signal, at the timing T0, the control unit 12 changes the pulse signal StartP to an [H] level and supplies it to the A/D conversion section 11. The control unit 12 then supplies to the A/D conversion section 11a sampling signal CKs having an arbitrary frequency that is output alternatingly at an [H] level and an [L] level. At the timing T1, the control unit 12 changes the φSE signal to an [H] level and thereby changes the fourth transistor 26 to ON. As a result, the optional pixel 10a and the A/D conversion section 11 are connected together.

At the timing T2, the control unit 12 changes the φRS signal to an [H] level and thereby changes the second transistor 24 to ON. As a result, a reset operation of the optional pixel 10a is begun. At the timing T3, the control unit 12 changes the φRS signal to an [L] level and thereby changes the second transistor 24 to OFF. As a result, the reset operation of the optional pixel 10a is completed.

At the timing T4, the control unit 12 changes the φCO signal to an [H] level so that the A/D conversion section 11 starts the counting of the reset signals from the pixel 10a. In addition, the A/D conversion section 11 holds a count value (C1) from when the counting started in the latch 5 in the A/D conversion section 11. At the timing T5, the control unit 12 changes the φCO signal to an [L] level so that the A/D conversion section 11 stops the counting of the reset signals from the pixel 10a in accordance with a period set by the control unit 12 (i.e., from the timing T4 to the timing T5; hereinafter, referred to as a first period). In addition, the A/D conversion section 11 holds a count value (C2) when the counting is stopped at the timing T5 in the latch 5 in the A/D conversion section 11.

At the timing T6, the control unit 12 changes the φTR signal to an [H] level and thereby changes the first transistor 23 to ON. As a result, the transferring of the signals accumulated in the photoelectric conversion element 21 within the pixel 10a to the memory element 22 is started. At the timing T7, the control unit 12 changes the φTR signal to an [L] level and thereby changes the first transistor 23 to OFF. As a result, the transferring of the signals accumulated in the photoelectric conversion element 21 within the pixel 10a to the memory element 22 is stopped.

At the timing T8, the control unit 12 once again changes the φCO signal to the [H] level so that the A/D conversion section 11 starts the counting of the video signals from the pixel element 10a. In addition, the A/D conversion section 11 holds a count value (C3) at the start of the counting in the latch 5 in the A/D conversion section 11. At the timing T9, the control unit 12 once again changes the φCO signal to an [L] level so that the A/D conversion section 11 stops the counting of the video signals from the pixel 10a in accordance with a period set by the control unit 12 (i.e., from the timing T8 to the timing T9; hereinafter, referred to as a second period). In addition, the A/D conversion section 11 holds a count value (C4) when the counting is stopped at the timing T9 in the latch 5 in the A/D conversion section 11.

At the timing T10, the control unit 12 changes the φSE signal to the [L] level so that the fourth transistor 26 is changed to OFF. As a result, the connection between the optional pixel 10a and the A/D conversion section 11 is canceled.

At the timing T11, the A/D conversion section 11 subtracts the count value (C3) which was held in the latch 5 at the timing T8 from the count value (C4) which was held in the latch 5 at the timing T9, so as to obtain a first count value. In addition, the A/D conversion section 11 subtracts the count value (C1) which was held in the latch 5 at the timing T4 from the count value (C2) which was held in the latch 5 at the timing T5, so as to obtain a second count value. Furthermore, the A/D conversion section 11 subtracts the second count value from the first count value, and starts a signal output to a latter-stage signal processing circuit (not shown). At the timing T12, the A/D conversion section 11 stops the above described subtractions, and at the same time stops the signal output to the latter-stage signal processing circuit (not shown).

Figure 3:
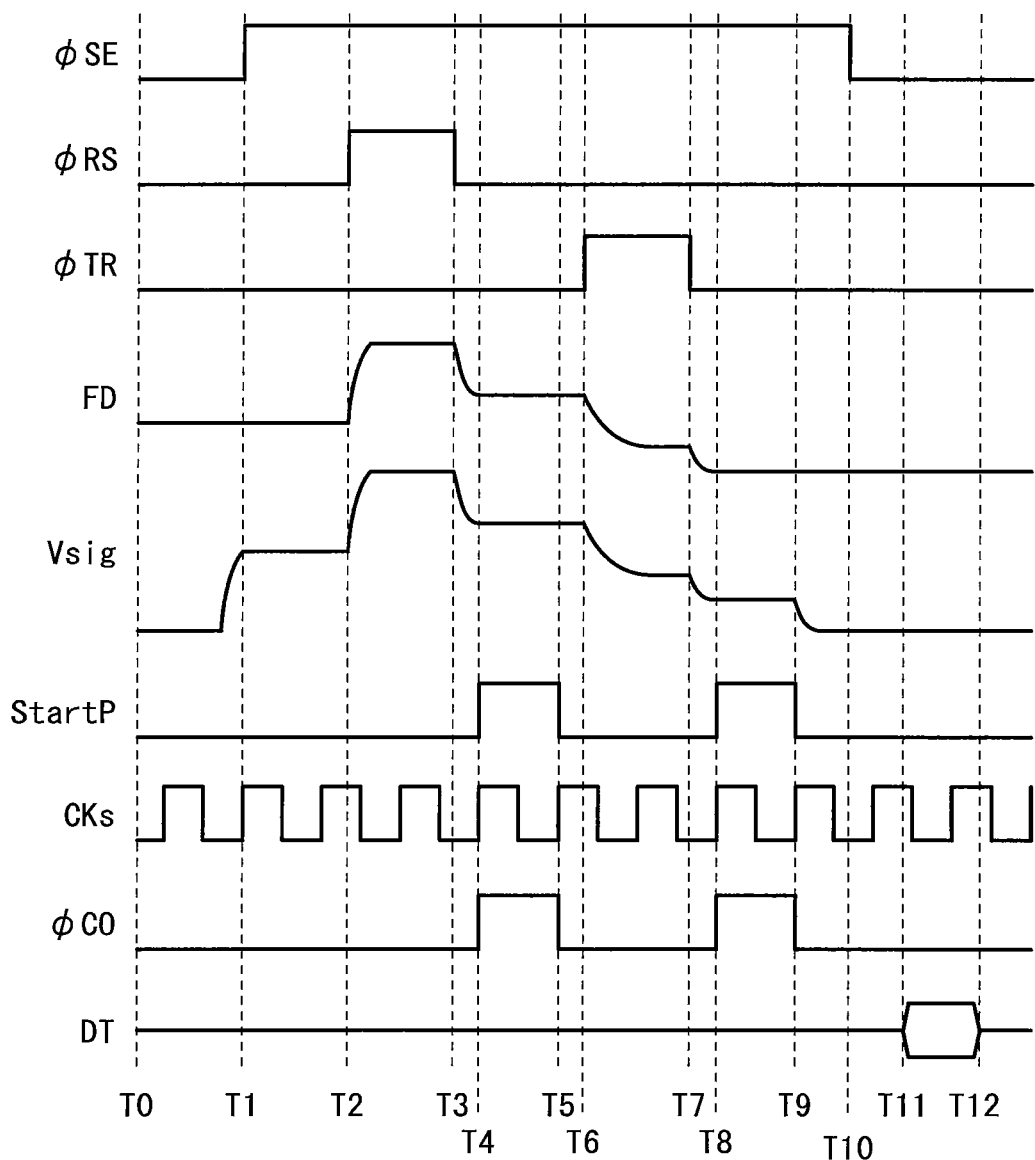
FIG. 3 is a timing chart showing an operation of the imaging device according to the first embodiment.

Here, a case has been described in which the above described timings T0 and T1, T1 and T2, T3 and T4, T5 and T6, T7 and T8, T9 and T10, and T10 and T11 are separate timings, however, these operations may also be simultaneous operations. In addition, operations of the counter 3 may also be stopped during periods other than the first period (i.e., from the timing T4 to the timing T5) and the second period (i.e., from the timing T8 to the timing T9). Furthermore, as is shown in FIG. 3, by changing the pulse signal StartP to the [H] level for only the same period as the φCO signal, operations of the pulse transit circuit 1 may be stopped for periods other than the first and second periods.

As is described above, the A/D conversion section 11 counts clocks whose frequency corresponds to the size of the analog input voltage value Vin during an arbitrary period. Because of this, the A/D conversion section 11 has the characteristic that the count value increases as the count period lengthens, and the count value decreases as the count period shortens. Moreover, the resolution of the imaging signal in the pixel 10a that is created based on the count values (C1 to C4) held in the latch 5 depends on the lengths of the first period and second period. Because of this, if the length of each period is different, the resolution of the imaging signal, which is the result of the difference in the count values, is restricted to the shorter of the first period and the second period, and there is a deterioration in the signal accuracy. Accordingly, in the present embodiment, the control unit 12 sets the first period and the second period such that they are the same length.

As has been described above, by setting the first period and the second period the same length in the A/D conversion section 11, it becomes possible to detect an imaging signal in a pixel 10a with a high degree of accuracy, and the image quality during photography can be increased. In addition, it is possible to stop counting operations of the A/D conversion section 11 during periods other than the counting period, and thereby reduce power consumption. Furthermore, it also becomes possible to stop operations of the A/D conversion section 11 being performed outside the first period and the second period, and to thereby reduce power consumption.

Second Operating Example

Next, a second operating example will be described with reference made to FIG. 2. The second operating example differs from the first operating example in the operations of the A/D conversion section 11 at the timings T4, T5, T8, T9, T11, and T12. Accordingly, descriptions of other operations are omitted.

More specifically, at the timing T4, the control unit 12 changes the φCO signal to an [H] level. Upon receiving this, the A/D conversion section 11 sets the count value to its initial value (i.e., the count lower limit value or upper limit value) by resetting the count value at the count start time, and starts the count of the reset signals from the pixel 10a. At the timing T5, the control unit 12 changes the φCO signal to an [L] level so that the A/D conversion section 11 stops the count of the reset signals from the pixel 10a in accordance with the period set by the control unit 12 (i.e., from the timing T4 to the timing T5; hereinafter, referred to as the first period). In addition, the A/D conversion section 11 holds the count value (C1) at the time the counting was stopped at the timing T5 in the latch 5 in the A/D conversion section 11.

At the timing T8, the control unit 12 once again changes the φCO signal to an [H] level. Upon receiving this, the A/D conversion section 11 sets the count value to its initial value (i.e., the count lower limit value or upper limit value) by resetting the count value at the count start time, and starts the count of the video signals from the pixel 10a. At the timing T9, the control unit 12 once again changes the φCO signal to an [L] level so that the A/D conversion section 11 stops the count of the video signals from the pixel 10a in accordance with the period set by the control unit 12 (i.e., from the timing T8 to the timing T9; hereinafter, referred to as the second period). In addition, the A/D conversion section 11 holds the count value (C2) at the time the counting was stopped at the timing T9 in the latch 5 in the A/D conversion section 11.

At the timing T11, the A/D conversion section 11 starts a calculation to subtract the count value (C1) which was held in the latch 5 at the timing T5 from the count value (C2) which was held in the latch 5 at the timing T9. In addition, the A/D conversion section 11 starts a signal output to a latter-stage signal processing circuit (not shown). At the timing T12, the A/D conversion section 11 stops the above described subtraction, and at the same time stops the signal output to the latter-stage signal processing circuit (not shown).

In the second operating example as well, in the same way as in the first operating example, the control unit 12 sets the first period and the second period such that they are the same length. By doing this, it becomes possible to detect an imaging signal in a pixel 10a with a high degree of accuracy, and the image quality during photography can be increased. In addition, by setting the count value when the count is started at the timings T4 and T8 in the A/D conversion section 11 to the initial value, it is no longer necessary to hold the count value for the time when counting was started. As a result of this, because it is possible to reduce the number of latch circuits in the A/D conversion circuit 11, the circuit size can also be reduced.

Second Embodiment

Figure 4:
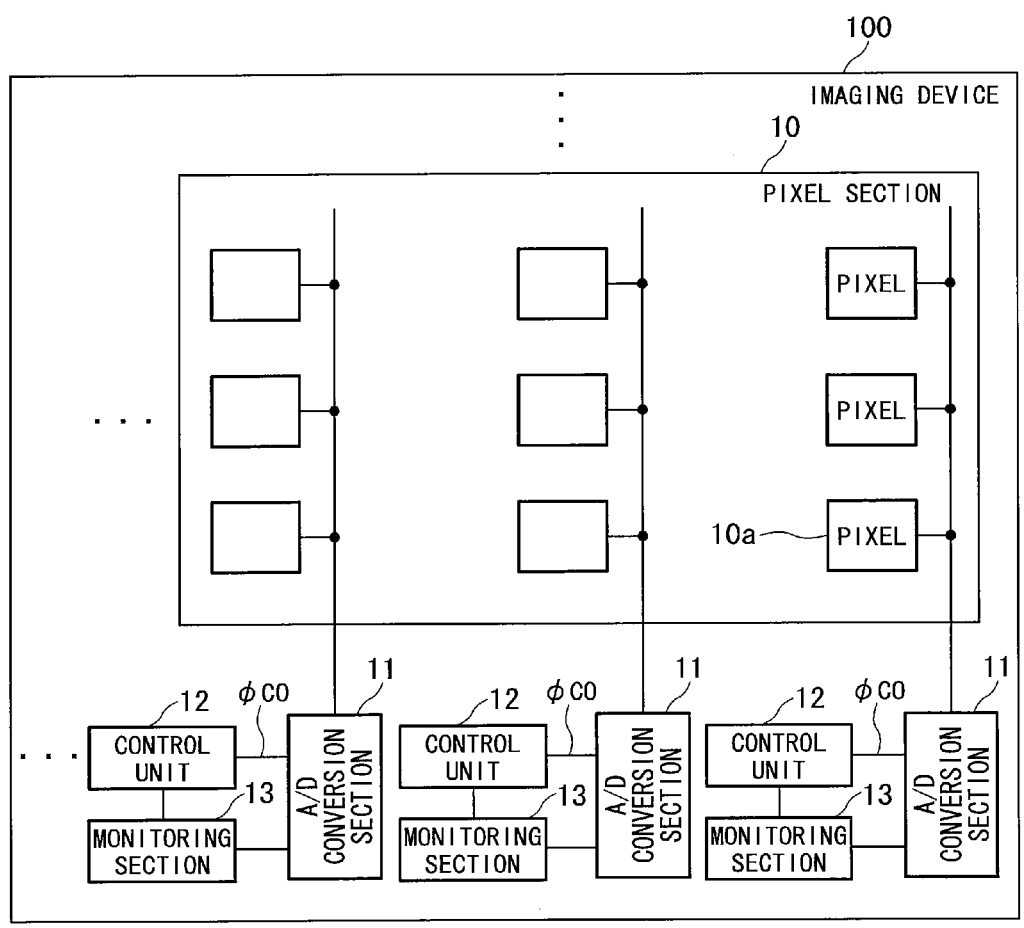
FIG. 4 is a block diagram showing the structure of an imaging device according to a second embodiment.

Next, a second embodiment of the present invention will be described. FIG. 4 shows the structure of an imaging device according to the present embodiment, and elements that are the same as those of the first embodiment are given the same symbols. This imaging device differs from the imaging device of the first embodiment in that a monitoring section 13 that monitors the length of the count period of the A/D conversion section 11 is provided in the imaging device 100. A description of the rest of the structure is omitted.

Figure 5:
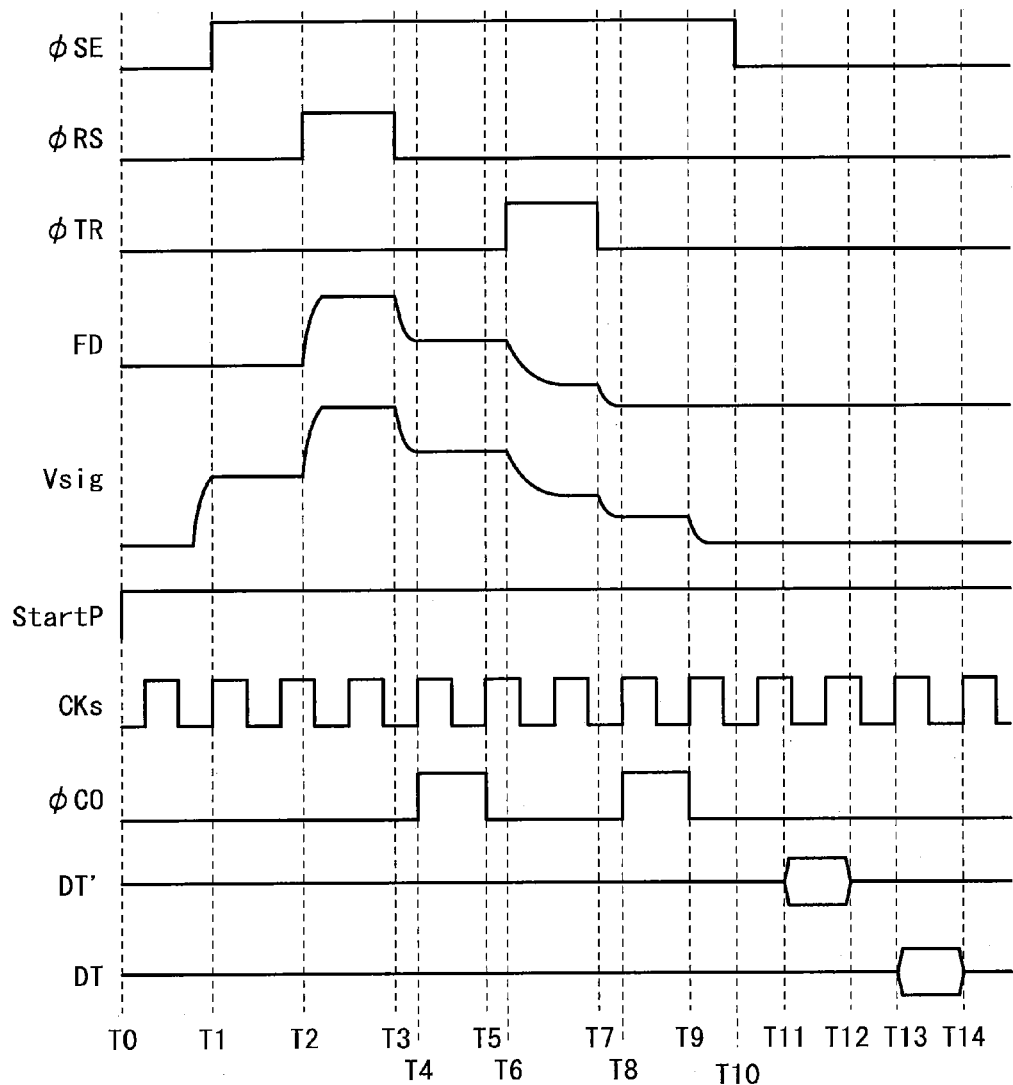
FIG. 5 is a timing chart showing an operation of the imaging device according to the second embodiment.

Next, operating examples that are characteristic of an imaging device having the aforementioned structure will be described using timing charts. FIG. 5 shows operations of the imaging device according to the present embodiment.

Once the photoelectric conversion element 21 has completed the conversion of the subject image to an imaging signal, at the timing T0, the control unit 12 changes the pulse signal StartP to an [H] level and supplies it to the A/D conversion section 11. The control unit 12 then supplies to the A/D conversion section 11a sampling signal CKs having an arbitrary frequency that is output alternatingly at an [H] level and an [L] level. At the timing T1, the control unit 12 changes the φSE signal to an [H] level and thereby changes the fourth transistor 26 to ON. As a result, the optional pixel 10a and the A/D conversion section 11 are connected together.

At the timing T2, the control unit 12 changes the φRS signal to an [H] level and thereby changes the second transistor 24 to ON. As a result, a reset operation of the arbitrary pixel 10a is begun. At the timing T3, the control unit 12 changes the φRS signal to an [L] level and thereby changes the second transistor 24 to OFF. As a result, the reset operation of the optional pixel 10a is completed.

At the timing T4, the control unit 12 changes the φCO signal to an [H] level so that the A/D conversion section 11 starts the counting of the reset signals from the pixel 10a. In addition, the A/D conversion section 11 holds a count value (C1) from when the counting started in the latch 5 in the A/D conversion section 11. At the same time as this, the monitoring section 13 starts measuring the period that the φCO signal supplied to the A/D conversion section 11 is at an [H] level.

At the timing T5, the control unit 12 changes the φCO signal to an [L] level so that the A/D conversion section 11 stops the counting of the reset signals from the pixel 10a in accordance with a period set by the control unit 12 (i.e., from the timing T4 to the timing T5; hereinafter, referred to as a first period). In addition, the A/D conversion section 11 holds in the latch 5 in the A/D conversion section 11a count value (C2) at the point when the counting is stopped at the timing T5. At the same time as this, the monitoring section 13 stops measuring an [H] level period of the φCO signal supplied to the A/D conversion section 11, and holds a value (TR) of this measurement in the latch 5 in the A/D conversion section 11.

At the timing T6, the control unit 12 changes the φTR signal to an [H] level and thereby changes the first transistor 23 to ON. As a result, the transferring of the signals accumulated in the photoelectric conversion element 21 within the pixel 10a to the memory element 22 is started. At the timing T7, the control unit 12 changes the φTR signal to an [L] level and thereby changes the first transistor 23 to OFF. As a result, the transferring of the signals accumulated in the photoelectric conversion element 21 within the pixel 10a to the memory element 22 is stopped.

At the timing T8, the control unit 12 once again changes the φCO signal to the [H] level so that the A/D conversion section 11 starts the counting of the video signals from the pixel element 10a. In addition, the A/D conversion section 11 holds a count value (C3) from the point when the counting started in the latch 5 in the A/D conversion section 11. At the same time as this, the monitoring section 13 starts measuring an [H] level period of the φCO signal supplied to the A/D conversion section 11.

At the timing T9, the control unit 12 once again changes the φCO signal to an [L] level so that the A/D conversion section 11 stops the counting of the video signals from the pixel 10a in accordance with a period set by the control unit 12 (i.e., from the timing T8 to the timing T9; hereinafter, referred to as a second period). In addition, the A/D conversion section 11 holds a count value (C4) from the point when the counting is stopped at the timing T9 in the latch 5 in the A/D conversion section 11. At the same time as this, the monitoring section 13 stops measuring an [H] level period that the φCO signal supplied to the A/D conversion section 11, and holds a value (TI) of this measurement in the latch 5 in the A/D conversion section 11.

At the timing T10, the control unit 12 changes the φSE signal to the [L] level so that the fourth transistor 26 is changed to OFF. As a result, the connection between the optional pixel 10a and the A/D conversion section 11 is canceled.

At the timing T11, the A/D conversion section 11 subtracts the count value (C3) which was held in the latch 5 at the timing T8 from the count value (C4) which was held in the latch 5 at the timing T9, so as to obtain a first count value. In addition, the A/D conversion section 11 subtracts the count value (C1) which was held in the latch 5 at the timing T4 from the count value (C2) which was held in the latch 5 at the timing T5, so as to obtain a second count value. Furthermore, in accordance with the control performed by the control unit 12, the A/D conversion section 11 starts the correction of one of the first count value and the second count value based on the ratio of the lengths of the measurement value (TR) of an [H] level period of the φCO signal at the timing T5 and the measurement value (TI) of an [H] level period of the φCO signal at the timing T9.

More specifically, the A/D conversion section 11 performs the correction using the following Formula (1) when TR>TI, and using the following Formula (2) when TI>TR.

$$HR = (C2 - C1) \times TI \div TR \quad (1)$$

$$HI = (C4 - C3) \times TR \div TI \quad (2)$$

As has been described above, the resolution of the imaging signal depends on the lengths of the first period and second period, and the resolution of the imaging signal increases as the length of the count period is lengthened. Because of this, of the above described first count value and second count value, a greater accuracy is guaranteed from the count value having the longer count period than from the count value having the shorter count period. Accordingly, in the present embodiment, the count value having the longer count period is corrected in the manner described above. Note that, conversely to what is described above, it is also possible for the count value having the shorter count period to be corrected as long as the deterioration of the signal accuracy is within an acceptable range.

At the timing T12, the A/D conversion section 11 stops the above described correction of the count value. At the timing T13, the A/D conversion section 11 starts calculating the imaging signal of the pixel 10a using the count values (HR or HI) corrected at the timing T12. Moreover, the A/D conversion section 11 starts a signal output to a latter-stage signal processing circuit (not shown). In this calculation, the following Formula (3) is used when TR>TI, and the following Formula (4) is used when TI>TR.

$$DT = (C4 - C3) - HR \quad (3)$$

$$DT = HI - (C2 - C1) \quad (4)$$

At the timing T14, the A/D conversion section 11 stops the above described calculation the imaging signal, and at the same time stops the signal output to the latter-stage signal processing circuit (not shown).

Figure 6:
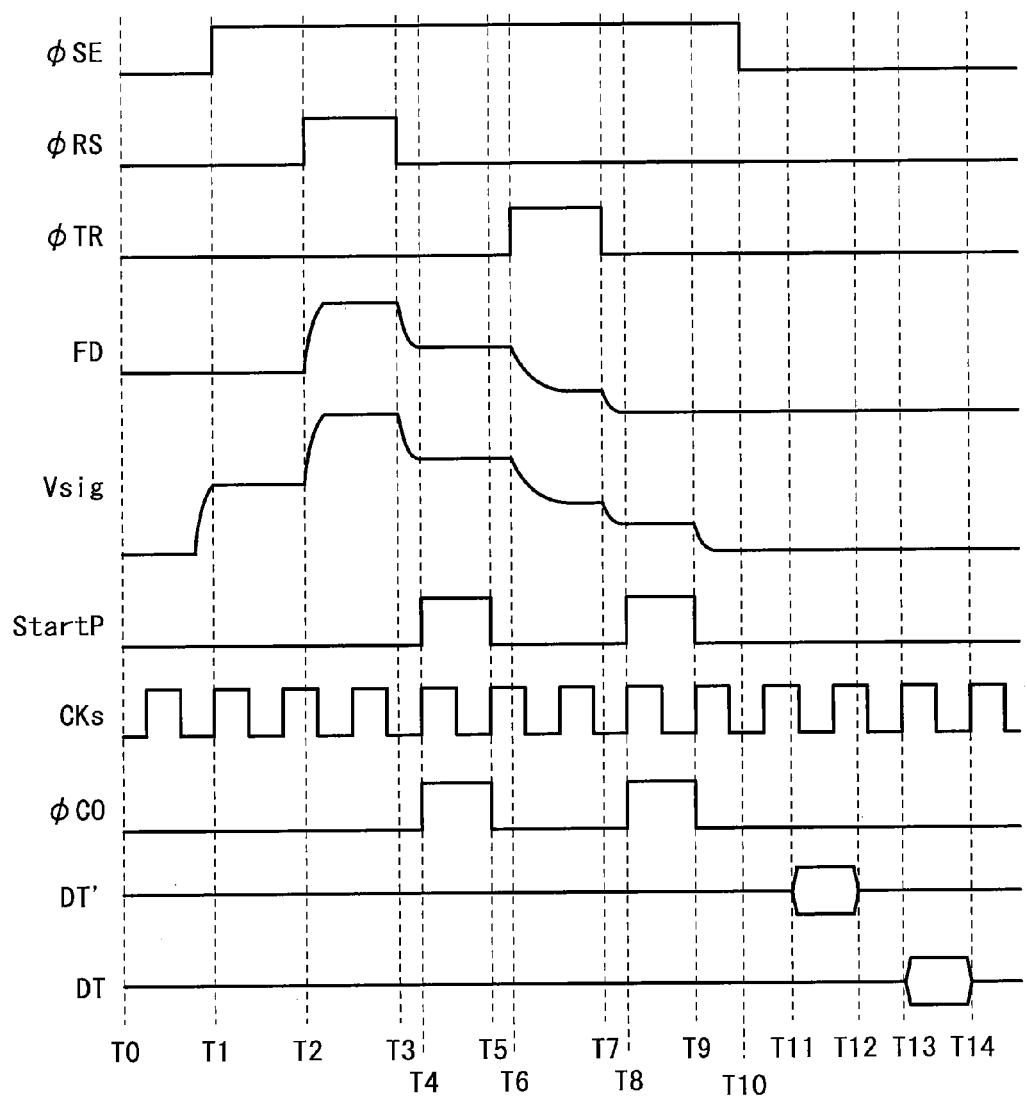
FIG. 6 is a timing chart showing an operation of the imaging device according to the second embodiment.

Here, a case has been described in which the above described timings T0 and T1, T1 and T2, T3 and T4, T5 and T6, T7 and T8, T9 and T10, T10 and T11, and T12 and T13 are separate timings, however, these operations may also be simultaneous operations. In addition, operations of the counter 3 may also be stopped during periods other than the first period (i.e., from the timing T4 to the timing T5) and the second period (i.e., from the timing T8 to the timing T9). Furthermore, as is shown in FIG. 6, by changing the pulse signal StartP to the [H] level for only the same period as the φCO signal, operations of the pulse transit circuit 1 may be stopped during periods other than the first and second periods.

As has been described above, by correcting the count value, it becomes possible for the first period and the second period to be set to the same length in the A/D conversion section 11. Because of this, it becomes possible to detect an imaging signal in a pixel 10a with a high degree of accuracy, and the image quality during photography can be increased. In addition, because it is possible to stop counting operations of the A/D conversion section 11 during periods other than the counting period, power consumption can be reduced. Furthermore, because it is also possible to stop operations of the A/D conversion section 11 being performed outside the first period and the second period, power consumption can be reduced.

Third Embodiment

Next, a third embodiment of the present invention will be described. The present embodiment relates to an imaging device that is able to suppress a black level depression phenomenon that is generated when extremely strong light is irradiated onto a pixel cell. Hereinafter, a description of this black level depression phenomenon will be given.

When detecting a difference between a rest level Vr and a signal level Vs, if extremely strong light is irradiated onto the pixel cell, then a problem known as black level depression phenomenon occurs. (a) in FIG. 14 shows the reset level Vr and signal level Vs relative to the light amount, while (b) in FIG. 14 shows the differential result Vs−Vr. When the amount of incident light is greater than a point B, Vs becomes saturated resulting in Vs−Vr becoming a constant value. If even stronger light is irradiated and the amount of incident light is greater than a point C, then the reset level Vr changes, and Vs−Vr becomes smaller. This is the black level depression phenomenon.

If extremely strong light is irradiated onto a pixel cell, then because the light leakage signal is added to the reset level, the above described type of change in the reset level Vr is generated. Furthermore, when the reset level Vr reaches saturation because of light leakage (at a point D), the differential result Vs−Vr changes to zero.

Figure 7:
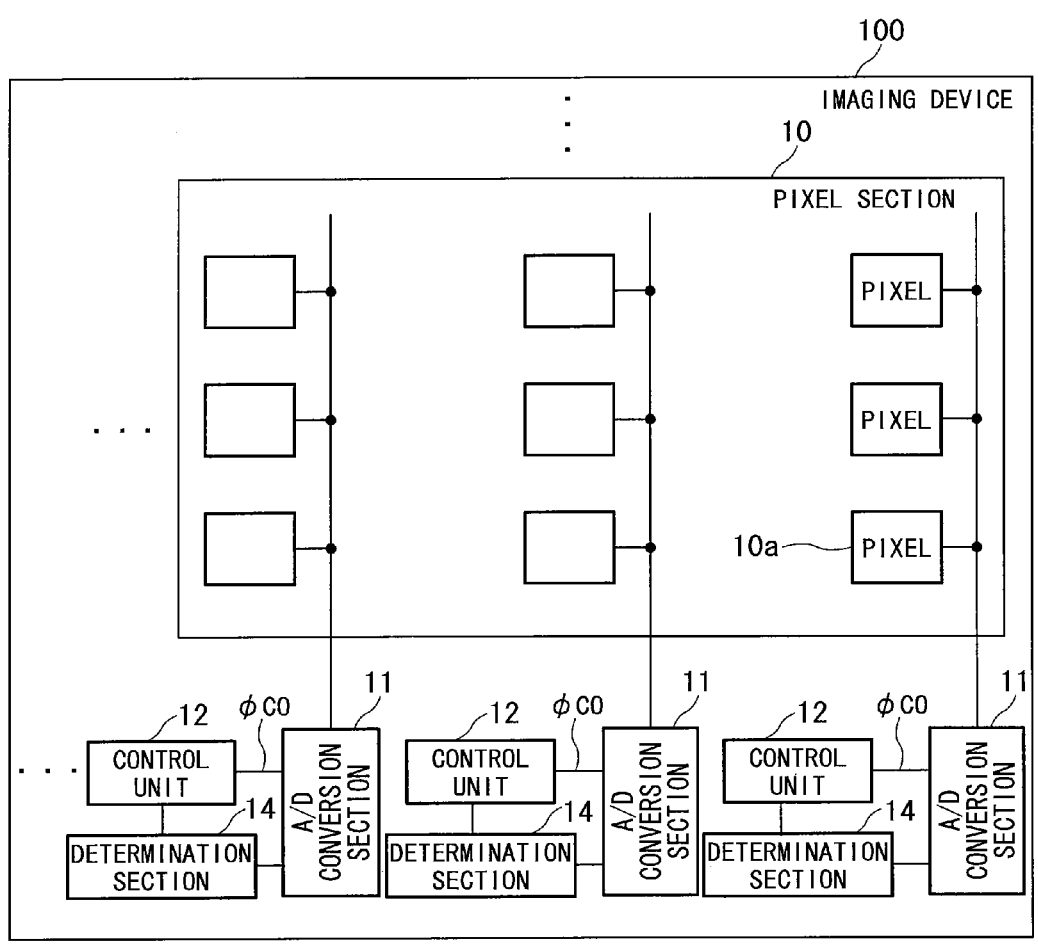
FIG. 7 is a block diagram showing the structure of an imaging device according to a third embodiment.

FIG. 7 shows the structure of an imaging device according to the present embodiment, and elements that are the same as those in FIG. 1 are given the same symbols. This imaging device differs from the imaging device of the first embodiment in that a determination section 14 that determines the count value of the reset signal level held in the latch 5 in the A/D conversion section 11 is provided in the imaging unit 100. Moreover, based on the results of determinations made by the determination section 14, the control unit 12 controls the A/D conversion section 11 such that when the count value of the reset signal level is equal to or greater than a predetermined determination threshold value, this value continues to be held, while when the count value of the reset signal level is less than the determination threshold value, the count value of the reset signal level is replaced with a predetermined count value. A description of the rest of the structure is omitted.

Figure 8:
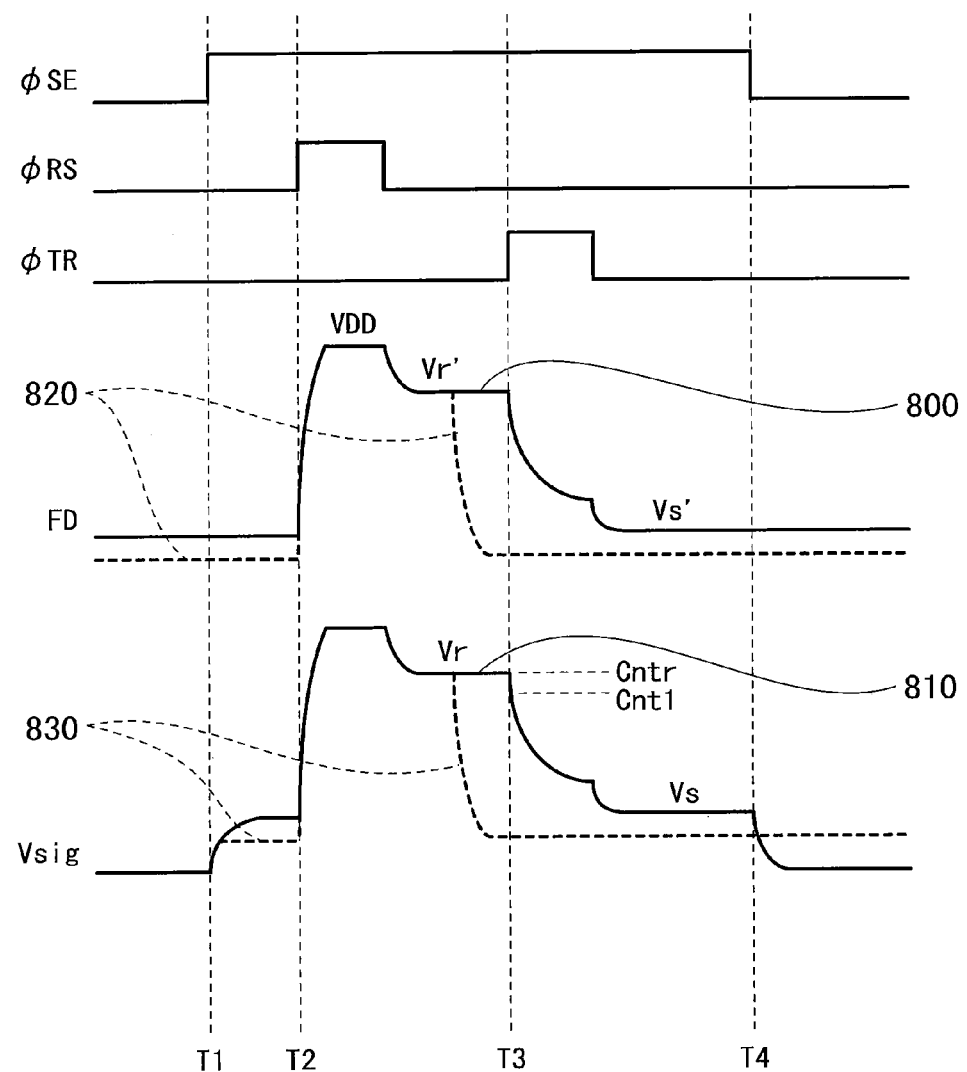
FIG. 8 is a timing chart used to illustrate a relationship between a determination threshold value and a count value according to the third embodiment.

A description of a relationship between the count value and the determination threshold value used by the determination section 14 will now be given using the pixel cell timing chart shown in FIG. 8. In FIG. 8, changes in the control pulses φSE, φRS, and φTR are shown. Furthermore, in FIG. 8, a signal waveform of the level of the memory element 22 is shown by FD, and a signal waveform of the pixel output which is output to the common signal line 27 is shown by Vsig. The waveforms 800 and 810 (solid lines) shown in the drawing are signal waveforms created when light that does not generate a black level depression phenomenon is irradiated onto a pixel cell. The waveforms 820 and 830 (broken lines) shown in the drawing are signal waveforms created when light that generates a black level depression phenomenon is irradiated onto a pixel cell. Immediately after the control pulse φRS transits from an [H] level to an [L] level, due to the aforementioned light leakage, the reset level of the memory element 22 (FD) and the reset level of the pixel output (Vsig) are abruptly reduced.

Because the state of the reset level changes in this manner depending on the existence or otherwise of a black level depression phenomenon, by determining this reset level, it is possible to determine whether or not a black level depression phenomenon has been generated. Cntr in FIG. 8 is the count value that corresponds to the reset level Vr of the pixel output when a black level depression phenomenon has not being generated. Cntl is the determination threshold value. When the pixel output reset level is equal to or less than the determination threshold value Cntl, by replacing the count value of the reset signal level with the count value Cntr that corresponds to Vr, black level depression phenomenon is not generated even if differential processing between this value and the count value of the signal level is performed.

Figure 9:
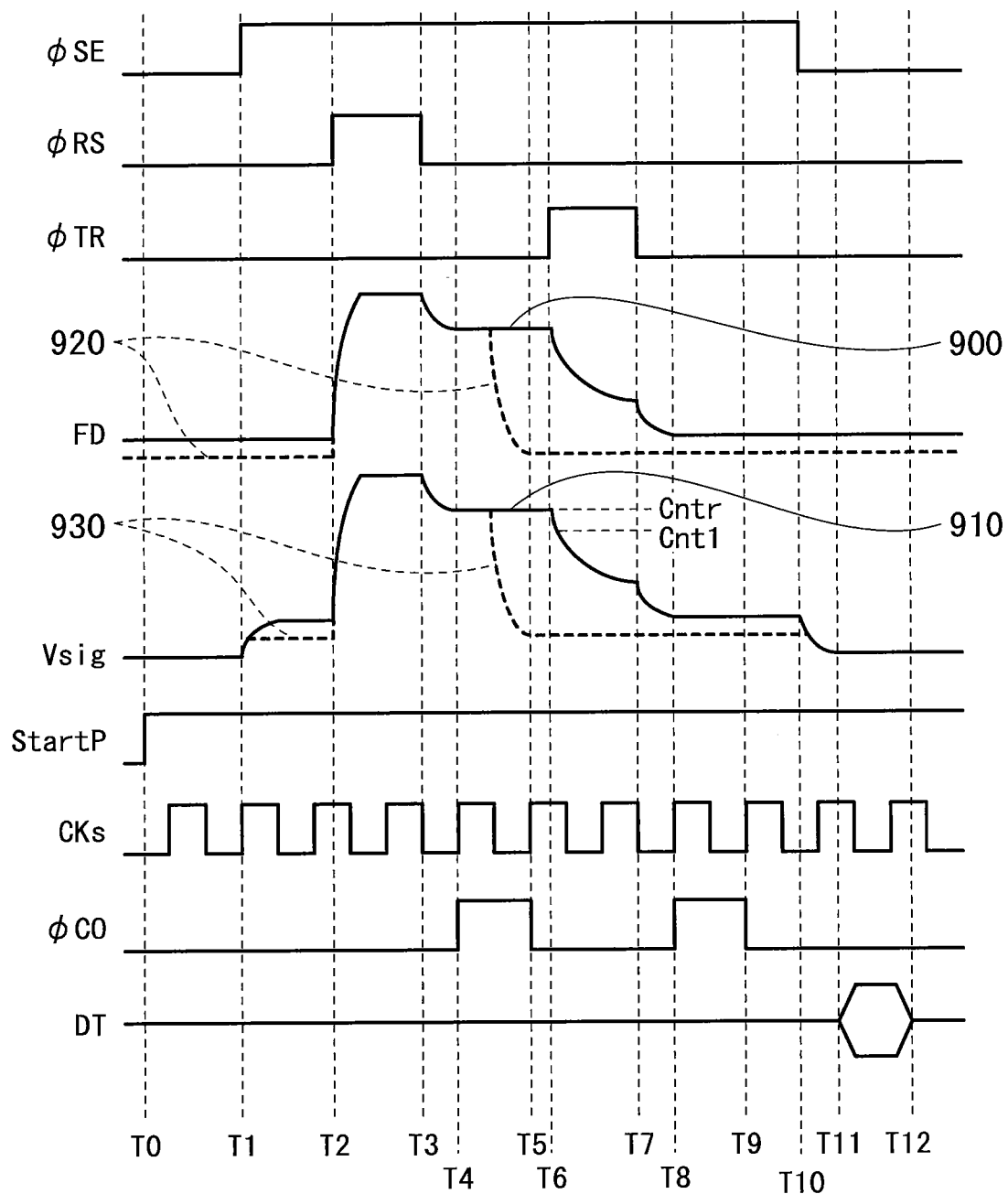
FIG. 9 is a timing chart showing an operation of the imaging device according to the third embodiment.
Figure 10:
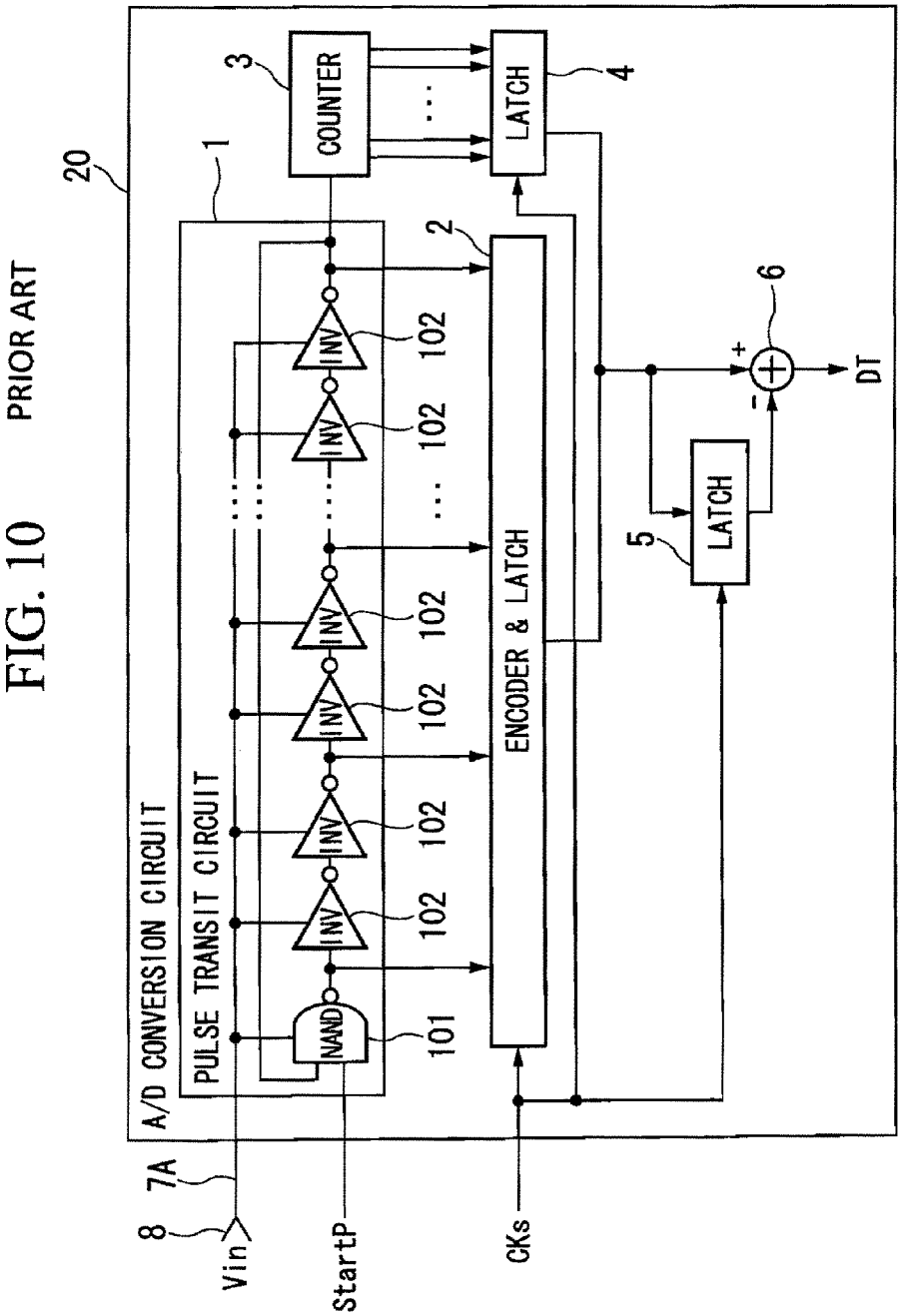
FIG. 10 is a block diagram showing the structure of an A/D conversion circuit.
Figure 11A:
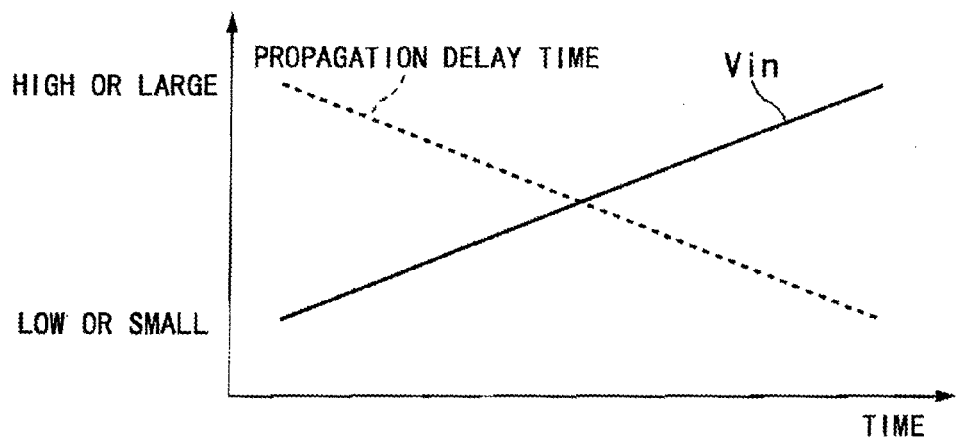
FIG. 11A is a reference diagram used to illustrate an operation of an A/D conversion circuit.
Figure 11B:
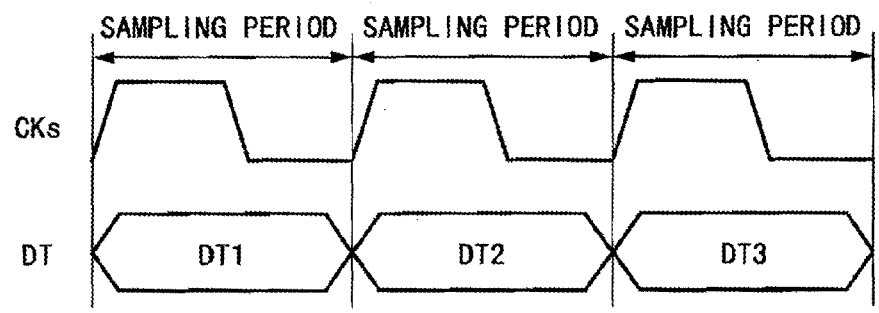
FIG. 11B is a reference diagram used to illustrate an operation of an A/D conversion circuit.

Next, an operating example characterizing an imaging device having the above described structure will be described using the timing chart shown in FIG. 9. The waveforms 900 and 910 (solid lines) shown in the drawing are signal waveforms created when light that does not generate a black level depression phenomenon is irradiated. In addition, the waveforms 920 and 930 (broken lines) are signal waveforms created when light that does generate a black level depression phenomenon is irradiated.

Once the photoelectric conversion element 21 has completed the conversion of the subject image to an imaging signal, at the timing T0, the control unit 12 changes the pulse signal StartP to an [H] level and supplies it to the A/D conversion section 11. The control unit 12 then supplies to the A/D conversion section 11a sampling signal CKs having an arbitrary frequency that is output alternatingly at an [H] level and an [L] level. At the timing T1, the control unit 12 changes the φSE signal to an [H] level and thereby changes the fourth transistor 26 to ON. As a result, the optional pixel 10a and the A/D conversion section 11 are connected together.

At the timing T2, the control unit 12 changes the φRS signal to an [H] level and thereby changes the second transistor 24 to ON. As a result, a reset operation of the optional pixel 10a is begun. At the timing T3, the control unit 12 changes the φRS signal to an [L] level and thereby changes the second transistor 24 to OFF. As a result, the reset operation of the optional pixel 10a is completed.

At the timing T4, the control unit 12 changes the φCO signal to an [H] level. Upon receiving this, the A/D conversion section 11 sets the count value to its initial value (i.e., the count lower limit value or upper limit value) by resetting the count value at the count start time, and starts the count of the reset signals from the pixel 10a. At the timing T5, the control unit 12 changes the φCO signal to an [L] level so that the A/D conversion section 11 stops the counting of the reset signals from the pixel 10a in accordance with the period set by the control unit 12 (i.e., from the timing T4 to the timing T5; hereinafter, referred to as the first period). In addition, the A/D conversion section 11 holds the count value (C1) at the time the counting was stopped at the timing T5 in the latch 5 in the A/D conversion section 11.

At this time, the determination section 14 determines the count value held in the latch 5. In addition, based on the determination result, the control unit 12 controls the A/D conversion section 11 such that when the count value is equal to or greater than the determination threshold value Cntl, this value continues to be held, while when the count value is less than the determination threshold value Cntl, this count value is replaced with Cntr.

At the timing T6, the control unit 12 changes the φTR signal to an [H] level and thereby changes the first transistor 23 to ON. As a result, the transferring of the signals accumulated in the photoelectric conversion element 21 during an exposure period (not shown) to the memory element 22 is started. Here, if light that is strong enough to cause a black level depression phenomenon to be generated is irradiated, then because the reset level is already saturated, there is substantially no change in the signal level. At the timing T7, the control unit 12 changes the φTR signal to an [L] level and thereby changes the first transistor 23 to OFF. As a result, the transferring of the signals from the photoelectric conversion element 21 to the memory element 22 is stopped.

At the timing T8, the control unit 12 once again changes the φCO signal to the [H] level. Upon receiving this, the A/D conversion section 11 sets the count value to its initial value (i.e., the count lower limit value or upper limit value) by resetting the count value at the count start time, and starts the count of the video signals from the pixel 10a. At the timing T9, the control unit 12 once again changes the φCO signal to an [L] level so that the A/D conversion section 11 stops the count of the video signals from the pixel 10a in accordance with a period set by the control unit 12 (i.e., from the timing T8 to the timing T9; hereinafter, referred to as the second period). In addition, the A/D conversion section 11 holds the count value (C2) at the time the counting was stopped at the timing T9 in the latch 5 in the A/D conversion section 11.

At the timing T10, the control unit 12 changes the φSE signal to the [L] level so that the fourth transistor 26 is changed to OFF. As a result, the connection between the optional pixel 10a and the A/D conversion section 11 is canceled.

At the timing T11, the A/D conversion section 11 starts a calculation to subtract the count value (C1) which was held in the latch 5 at the timing T5 from the count value (C2) which was held in the latch 5 at the timing T9. In addition, the A/D conversion section 11 starts a signal output to a latter-stage signal processing circuit (not shown). At the timing T12, the A/D conversion section 11 stops the above described subtraction, and at the same time stops the signal output to the latter-stage signal processing circuit (not shown).

As has been described above, control is performed such that the count value of the reset signal level held in the latch 5 in the A/D conversion section 11 is determined, and the value continues to be held if it is equal to or greater than a predetermined determination threshold value, while if the value is less than the determination threshold value, it is replaced with a predetermined count value. As a result, it is possible to determine whether or not a black level depression phenomenon is present, and it becomes possible to suppress the generation of a black level depression phenomenon.

Note that in the above description, a case is described in which the count value of the reset level signal (C1) is determined and this count value of the reset level signal (C1) is controlled based on the result of this determination. However, it is also possible to determine the count value of the reset level signal (C1) and to control an imaging signal which is the result of a differential calculation (C2−C1) performed on the basis of the result of this determination. In this structure, if the count value of the reset signal level is less than the determination threshold value, control can be performed so as to replace the imaging signal with one that is at saturation level. By doing this, it becomes possible to suppress the generation of the black level depression phenomenon. It is also possible to use the maximum value that is capable of being output as the imaging signal for this saturation level. Moreover, it is also possible to determine in advance the actual saturation level when a black level depression is generated, and to then use the value thereof.

Moreover, the above description is based on a structure and operations that make it possible to suppress black level depression being applied to the structure shown in FIG. 1 and the timing chart shown in FIG. 3 of the first embodiment, however, they may also be applied to other structures and timing charts.

Embodiments of the present invention have been described above in detail with reference made to the drawings, however, the specific structure is not limited to the above described embodiments and various design modifications and the like may be applied insofar as they do not depart from the spirit or scope of the present invention.

INDUSTRIAL APPLICABILITY

According to the present invention, it is possible to detect an imaging signal with a high degree of accuracy by performing control such that the length of the counting period of a first count value is the same as the length of the counting period of a second count value.

DESCRIPTION OF THE REFERENCE NUMERALS

10 . . . Pixel portion
10a . . . Pixel
11 . . . A/D conversion section
12 . . . Control unit
13 . . . Monitoring section
14 . . . Determination section
100 . . . Imaging device

What is claimed is:
1. An imaging device, comprising:
a pixel section in which a plurality of pixels are arrayed two-dimensionally;
a pulse transit circuit generating clocks, where a frequency of said clocks corresponds to the size of output signals from said plurality of pixels;
a digital data generating circuit that counts said clocks and digitizes the result to generate count values, calculates a difference between a first count value that relates to output signals during a reset period of the pixel section and a second count value that relates to output signals during an exposure period of the pixel, and outputs said difference as an imaging signal for this pixel; and a control unit that controls the digital data generating circuit such that the length of a first counting period of the first count value is equal to the length of a second counting period of the second count value.

2. The imaging device according to claim 1, wherein the control unit stops operations of the digital data generating circuit outside the first counting periods and the second count periods.

3. The imaging device according to claim 1, wherein the control unit controls the digital data generating circuit such that the first count value is obtained by latching the count values at each of the start and the finish of the first counting period, and
the control unit controls the digital data generating circuit such that the second count value is obtained by latching the count values at each of the start and the finish of the second counting period.

4. The imaging device according to claim 1, wherein the control unit controls the digital data generating circuit such that the first count value is obtained by initializing the count value at the start of the first counting period, and
the control unit controls the digital data generating circuit such that the second count value is obtained by initializing the count value at the start of the second counting period and holds the count values at the finish of the second counting period.

5. The imaging device according to claim 1, further comprising a monitoring section that monitors the length of the first counting period and the length of the second counting period, wherein
the control unit controls the digital data generating circuit such that at least one of the first count value and the second count value is corrected based on the results of the monitoring by the monitoring section.

6. The imaging device according to claim 1, further comprising a determination section that determines the first count values, wherein
the control unit controls the digital data generating circuit such that the first count values are replaced with predetermined values, based on the results of the determination by the determination section.

7. The imaging device according to claim 1, further comprising a determination section that determines the first count values,
wherein the control unit controls the digital data generating circuit such that the imaging signals of the pixels are replaced with predetermined values, based on the results of the determination by the determination section.

* * * * *